United States Patent
Zhang et al.

(10) Patent No.: US 9,076,816 B2
(45) Date of Patent: Jul. 7, 2015

(54) METHOD AND DEVICE FOR SELF-ALIGNED CONTACT ON A NON-RECESSED METAL GATE

(71) Applicant: GLOBALFOUNDRIES Inc., Grand Cayman (KY)

(72) Inventors: Xunyuan Zhang, Albany, NY (US); Xiuyu Cai, Niskayuna, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/080,842

(22) Filed: Nov. 15, 2013

(65) Prior Publication Data

US 2015/0137273 A1    May 21, 2015

(51) Int. Cl.
*H01L 29/78*    (2006.01)
*H01L 29/66*    (2006.01)
*H01L 29/49*    (2006.01)

(52) U.S. Cl.
CPC .......... *H01L 29/66545* (2013.01); *H01L 29/78* (2013.01); *H01L 29/4958* (2013.01)

(58) Field of Classification Search
CPC ................... H01L 21/76829; H01L 21/28088; H01L 21/7685
USPC ........................................... 438/592; 257/412
See application file for complete search history.

(56) References Cited

U.S. PATENT DOCUMENTS

| 6,531,724 | B1 * | 3/2003 | Furukawa et al. | 257/288 |
|---|---|---|---|---|
| 8,084,311 | B1 * | 12/2011 | Horak et al. | 438/183 |
| 2002/0090777 | A1 * | 7/2002 | Forbes et al. | 438/238 |
| 2004/0253811 | A1 * | 12/2004 | Lee et al. | 438/633 |
| 2005/0275042 | A1 * | 12/2005 | Hwang et al. | 257/401 |
| 2006/0003550 | A1 |  1/2006 | Periasamy et al. |  |

OTHER PUBLICATIONS

T. Amazawa et al. "Selective Growth of Aluminium Using a Novel CVD System", Electron Devices Meeting, 1988, NTT LSI Laboratories, NTT Electronics Technology, 4 Pages.

* cited by examiner

*Primary Examiner* — Thao X Le
*Assistant Examiner* — Laura Dykes
(74) *Attorney, Agent, or Firm* — Ditthavong & Steiner, P.C.

(57) ABSTRACT

A methodology for forming a self-aligned contact (SAC) that exhibits reduced likelihood of a contact-to-gate short circuit failure and the resulting device are disclosed. Embodiments may include forming a replacement metal gate, with spacers at opposite sides thereof, on a substrate, forming a recess in an upper surface of the spacers along outer edges of the replacement metal gate, and forming an aluminum nitride (AlN) cap over the metal gate and in the recess.

20 Claims, 5 Drawing Sheets

METHOD AND DEVICE FOR SELF-ALIGNED CONTACT ON A NON-RECESSED METAL GATE

TECHNICAL FIELD

The present disclosure relates to self-aligned contact (SAC) formation in semiconductor devices. The present disclosure is particularly applicable to 14 nanometer (nm) technology nodes and beyond.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. This fabrication technique may degrade the metal gate electrode or cause interaction with the gate dielectric, thereby adversely impacting transistor performance.

Replacement metal gate (RMG) techniques have been developed to address problems attendant upon substituting metal gate electrodes for polysilicon gate electrodes. For example, a polysilicon dummy gate, formed on the substrate surrounded by spacers, is used during initial processing until high temperature annealing to activate source/drain implants has been implemented. Subsequently, an interlayer dielectric (ILD) is formed over the entire substrate, the polysilicon is removed, forming a cavity between the spacers, and a metal gate is formed in the cavity.

Additional issues arise with lateral scaling, such as the formation of contacts. For example, once the contacted poly pitch gets to about 80 nm, there is not enough room to land a contact between the gate lines and still maintain good electrical isolation properties between the gate line and the contact. SAC methodology has been developed to address this problem. A conventional SAC process insulates the gate metal from the contact metal by recessing the metal gate and inserting an insulating cap layer. The cap layer (e.g., silicon nitride (SiN)) insulates the gate metal from the partially overlapped contact metal. However, since the gate is formed of multiple metal layers (of different materials), effecting a uniform metal recess is a complicated process. Further, the material of the cap layer is susceptible to erosion during various subsequent processes, particularly the chemical mechanical polishing (CMP) of the ILD layer for a salicide process and during etching of the ILD for contact formation. Therefore, to obtain a sufficient/effective SAC cap (i.e., one having a thickness of at least 30 nm), a taller dummy gate is needed, which causes integration difficulties.

A need therefore exists for methodology enabling formation of a SAC on a non-recessed metal gate and the resulting device.

SUMMARY

An aspect of the present disclosure is an aluminum nitride (AlN) cap over a non-recessed metal gate.

Another aspect of the present disclosure is a method for forming an AlN cap on a metal gate and a recessed area adjacent to the metal gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a replacement metal gate, with spacers at opposite sides thereof, on a substrate, forming a recess in an upper surface of the spacers along outer edges of the replacement metal gate, and forming an AlN cap over the metal gate and in the recess.

Aspects of the present disclosure include the recess being formed to a depth of 3 nm to 10 nm. Additional aspects include forming the recess by a dry or wet etch process. Further aspects include the nitride cap being formed to a uniform thickness of 1 nm to 10 nm above an upper surface of the metal gate. Additional aspects include forming the AlN cap by forming an aluminum (Al) cap over the metal gate and in the recess and converting the Al to AlN. Further aspects include forming the Al cap by a selective growth process. Additional aspects include converting the Al cap to AlN by a nitrogen plasma treatment or a nitrogen plasma doping process. Further aspects include converting the Al cap to AlN at a process temperature less than 400 degrees Celsius (° C.). Additional aspects include forming an oxide layer to cover the metal gate and AlN cap to a uniform height above the substrate and forming a SAC through the oxide layer.

Another aspect of the present disclosure is device including a replacement metal gate, with spacers at opposite sides thereof, on a substrate, a recess in an upper surface of the spacers along outer edges of the replacement metal gate, and an AlN cap over the metal gate and in the recess.

Aspects include the recess having a depth of 3 nm to 10 nm. Additional aspects include the AlN cap having a uniform thickness of 1 nm to 10 nm above an upper surface of the metal gate. Further aspects include an oxide layer covering the metal gate and AlN cap to a uniform height above a substrate and a SAC through the oxide layer. Additional aspects include the SAC partially overlapping the AlN cap. Further aspects include the metal gate including a titanium nitride (TiN) barrier layer adjacent the spacers and the recess being formed adjacent the TiN barrier layer.

Another aspect of the present disclosure is a method of fabricating a semiconductor device, the method including: forming a replacement metal gate, with spacers at opposite sides thereof, on a substrate, forming a recess in an upper surface of the spacers along outer edges of the replacement metal gate, forming an AlN cap over the metal gate and in the recess by forming an Al cap over the metal gate and in the recess by a selective growth process, and converting the Al to AlN, forming an oxide layer to cover the metal gate and AlN cap to a uniform height above the substrate, and forming a SAC through the oxide layer partially overlapping the AlN cap.

Aspects include forming the recess by a dry or wet etch process. Additional aspects include forming the recess to a depth of 3 nm to 10 nm and forming the nitride cap to a uniform thickness of 1 nm to 10 nm above an upper surface of the metal gate. Further aspects include converting the Al cap to AlN by a nitrogen plasma treatment or a nitrogen plasma doping process at a process temperature less than 400° C. Additional aspects include forming the SAC by reactive ion etching (RIE) a contact hole and filling the contact hole with a contact metal.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Figure 1:
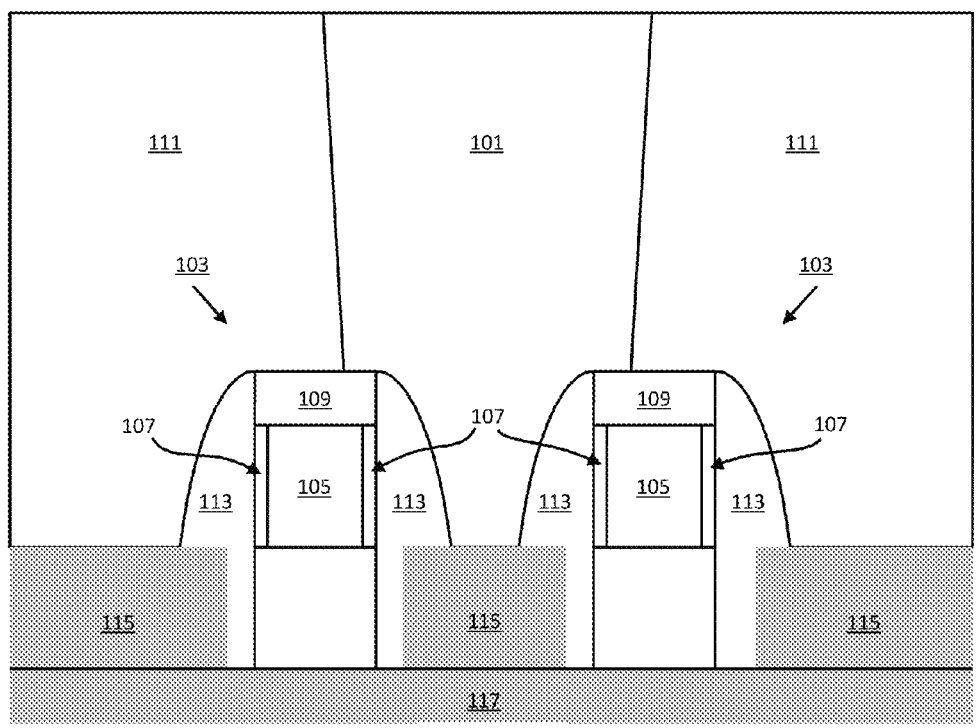
FIG. 1 schematically illustrates a SAC formed according to a conventional process.

FIG. 1 schematically illustrates a SAC 101 formed according to a conventional SAC process after an RMG process. As shown, the SAC 101 is aligned to the devices 103 on either side. In order to form the SAC 101, the gate metals 105 (e.g., Al or tungsten (W)) and the barrier layers 107 (e.g., TiN) of the devices 103 are recessed and the cap 109 (e.g. SiN) is formed within the recessed area. Thereafter, a dielectric material is deposited over the devices to form the ILD layer 111. (Note that spacers 113, source/drain regions 115, and a bottom portion of ILD 111 (up to a top surface of the gate) are formed on substrate 117 during the RMG process, prior to SAC formation.) The ILD layer 111 is etched to form contact areas within which the contact metal of the SAC 101 is deposited. The etching of the ILD layer 111 to form the contact areas, and CMP of the ILD during a salicide process, consume the materials of the cap 109. Thus, the resulting devices 103 remain susceptible to contact-to-gate short circuit failures between the SAC 101 and the gate metal 105, unless a taller dummy gate is employed in the RMG process. However, taller gates engender integration issues.

The present disclosure addresses and solves the current problem of contact-to-gate short circuit failures attendant upon contacts formed by a SAC process. In accordance with embodiments of the present disclosure, an AlN cap is formed on a non-recessed gate metal.

Methodology in accordance with embodiments of the present disclosure includes forming a replacement metal gate, with spacers at opposite sides thereof, on a substrate, forming a recess in an upper surface of the spacers along outer edges of the replacement metal gate, and forming an AlN cap over the metal gate and in the recess.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
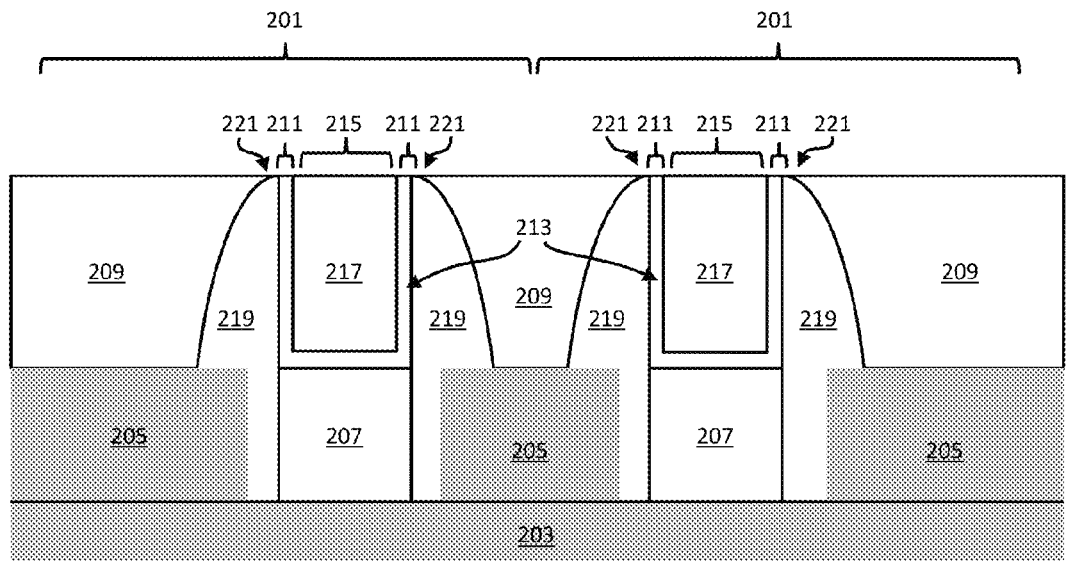
FIGS. 2A through 2G schematically illustrate a SAC formed in accordance with an exemplary embodiment of the present disclosure.

FIGS. 2A through 2G schematically illustrate a process for forming a SAC over a non-recessed gate metal, according to an exemplary embodiment of the present disclosure. FIG. 2A illustrates a cross section view of two adjacent devices 201 on a substrate 203 with source/drain regions 205 and gate stacks 207. An ILD layer 209 that was formed over the devices 201 has been polished such that the ILD layer 209 and the upper surfaces of the devices 201 are substantially coplanar. For example, the ILD layer 209 may be polished by a CMP process. The upper surface of each device 201 includes the upper surfaces 211 of the barrier layer 213 and an upper surface 215 of the metal gate 217. The devices 201 are separated from the surrounding ILD layer 209 by the spacers 219. The spacers 219 may be formed from a nitride (e.g., SiN). As shown, the upper surfaces 221 of the spacers 219 have also been exposed by the polishing.

Figure 2B:
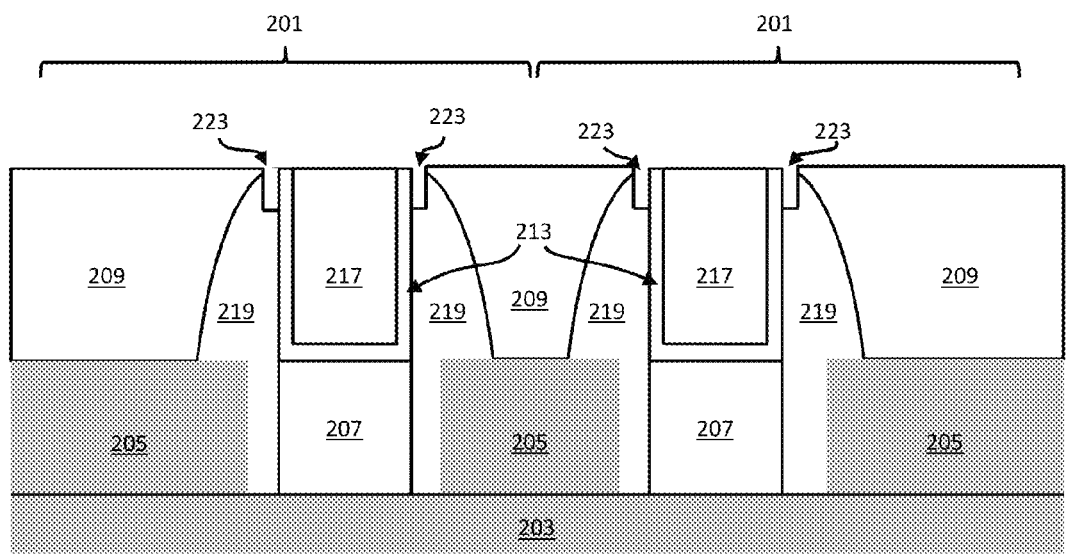

Adverting to FIG. 2B, the spacers 219 are selectively etched along the outer edges of the barrier layer 213 of each of the devices 201 to form the recesses 223. For example, a wet (e.g., hot phosphor) or dry (e.g., AMAT Frontier®) etch process may be used. It may be preferable to use an etch process with good selectivity with respect to the materials of the ILD 209 (e.g., silicon oxide (SiO)), barrier 213 (e.g., TiN), and metal gate 217 (e.g., W or Al, as well as work-function metals such as TiN, tantalum nitride (TaN), tantalum carbide (TaC), or titanium aluminum nitride (TiAlN)). As shown, the recesses 223 are formed adjacent to the barrier layers 213. As a result, side surfaces of the barrier layers 213 are partially exposed. The recesses 223 may be formed to a depth of 3 nm to 10 nm.

Figure 2C:
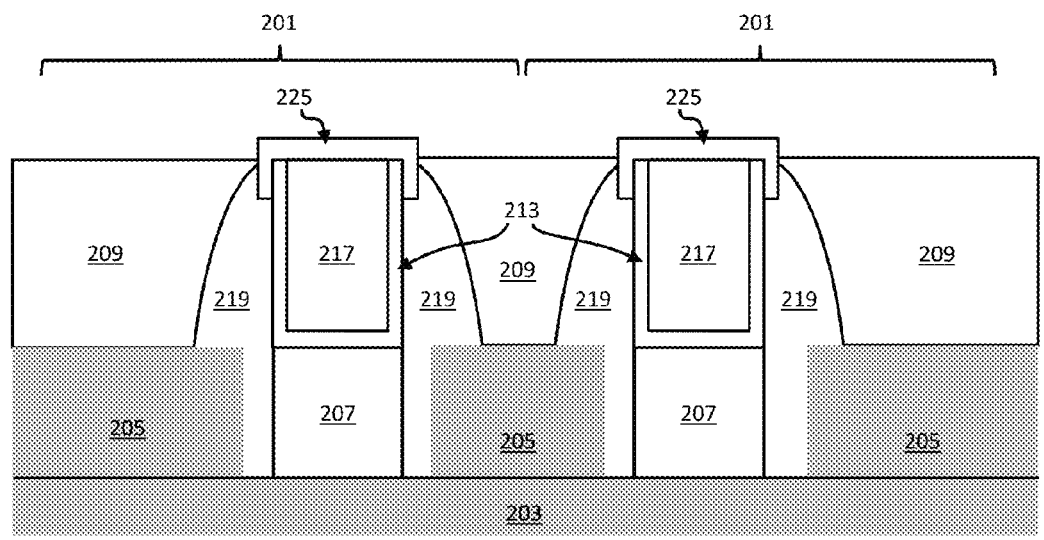

Adverting to FIG. 2C, a metal cap 225 is formed over the exposed surfaces of the metal gates 217 and the barrier layer 213 of the devices 201. The metal cap 225 may be formed from Al by a selective growth process (e.g., chemical vapor deposition (CVD) or atomic layer deposition (ALD)) to a thickness of 1 nm to 10 nm, e.g. to a thickness of approximately 5 nm.

Figure 2D:
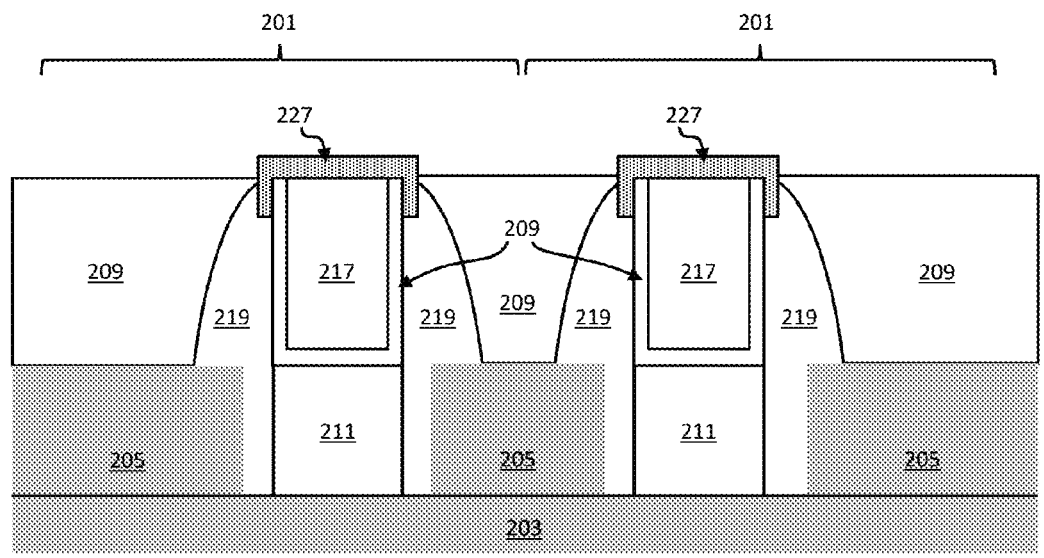

Adverting to FIG. 2D, a nitride cap 227 is formed by converting the metal cap 225 of FIG. 2C. For example, a nitrogen plasma treatment or nitrogen plasma doping process may be utilized to convert the Al of the metal cap 225 to AlN. The plasma concentration may be varied to suit the process conditions and tool configuration. For example, the duration and other process variables (e.g., temperature) may be varied or chosen according to the thickness of the metal cap 225. For instance, the nitride cap 227 may be formed by converting an Al metal cap (e.g., metal cap 225) to AlN by a nitrogen plasma treatment or a nitrogen plasma doping process at a process temperature less than 400° C.

Figure 2E:
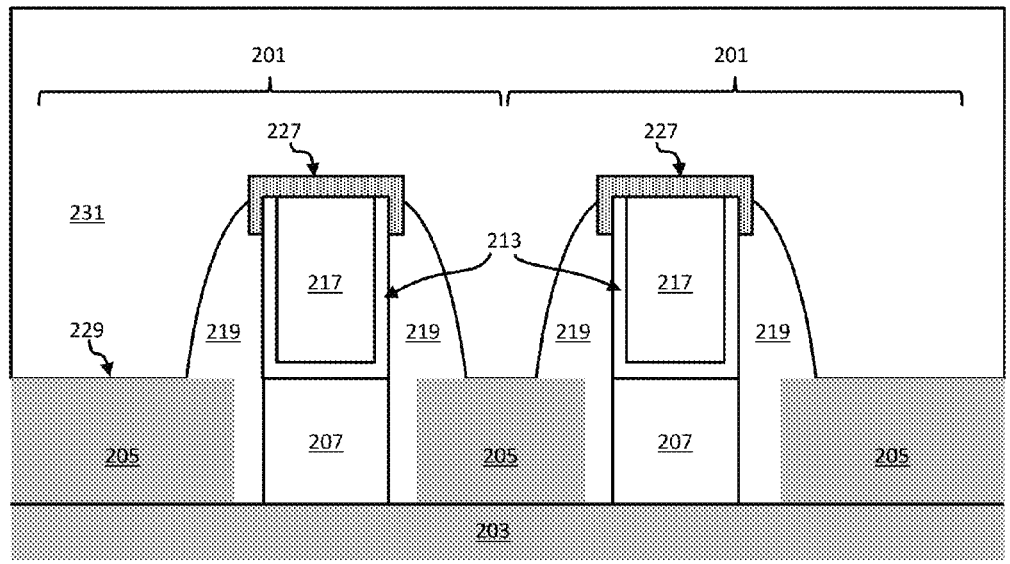

Adverting to FIG. 2E, the previously polished ILD layer 209 is now extended to cover the devices 201. For example, a SiO ILD layer (e.g., ILD layer 209) may be extended by a flowable (or other) CVD process so that it has a total thickness of approximately 50 nm as measured from an upper surface 229 of the source/drain regions 205. The extended ILD layer 231 may be polished by a CMP process after it has been extended.

Figure 2F:
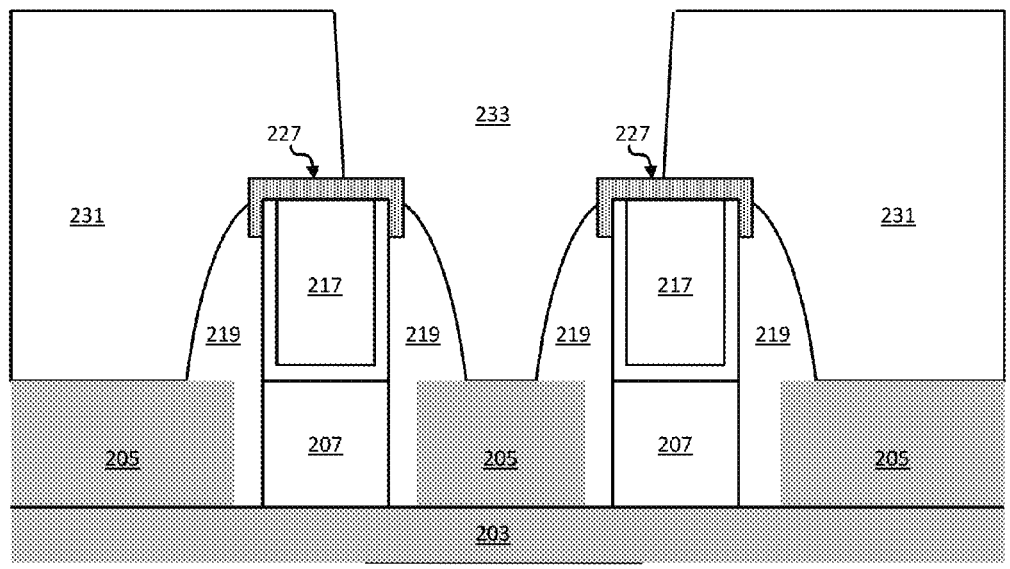
Figure 2G:
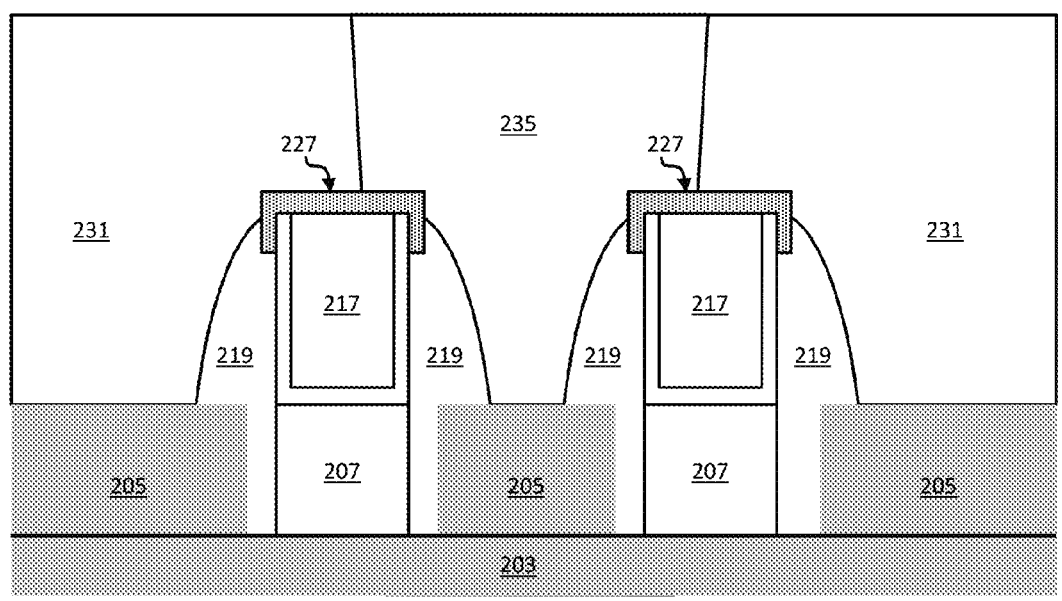

Adverting to FIG. 2F, the extended ILD layer 231 is etched, for example by an RIE, to form the contact area 233. AlN has a static dielectric constant of about 9 that is comparable to that of a SiN cap (~7). However, AlN is a superior insulator with a high hardness and chemical inertness. Therefore, the SiO of the extended ILD layer 231 has a significantly higher etch selectivity than the nitride of the nitride cap 227. Finally, as shown in FIG. 2G, a contact metal is deposited in the contact area to create the contact 235.

The embodiments of the present disclosure can achieve several technical effects, including a reduced likelihood of contact-to-gate short circuit failures, a simplified SAC process, and a short polysilicon gate. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a replacement metal gate, with spacers at opposite sides thereof and a barrier layer adjacent the spacers, on a substrate;
   forming a recess that penetrates an upper surface of the spacers, between an outer edge of the spacers and the barrier layer, and along outer edges of the replacement metal gate; and
   forming an aluminum nitride (AlN) cap over the metal gate and in the recess between the spacers and barrier layer.

2. The method according to claim 1, wherein the recess is formed to a depth of 3 nanometers (nm) to 10 nm.

3. The method according to claim 1, comprising forming the recess by a dry or wet etch process.

4. The method according to claim 1, wherein the nitride cap is formed to a uniform thickness of 1 nm to 10 nm above an upper surface of the metal gate.

5. The method according to claim 1, comprising forming the AlN cap by:
   forming an aluminum (Al) cap over the metal gate and in the recess; and
   converting the Al to AlN.

6. The method according to claim 5, comprising forming the Al cap by a selective growth process.

7. The method according to claim 6, comprising converting the Al cap to AlN by a nitrogen plasma treatment or a nitrogen plasma doping process.

8. The method according to claim 7, comprising converting the Al cap to AlN at a process temperature less than 400 degrees Celsius (° C.).

9. The method according to claim 1, further comprising:
   forming an oxide layer to cover the metal gate and AlN cap to a uniform height above the substrate; and
   forming a self-aligned contact (SAC) through the oxide layer.

10. A device comprising:
    a replacement metal gate, with spacers at opposite sides thereof, on a substrate;
    a recess that penetrates an upper surface of the spacers along outer edges of the replacement metal gate; and
    an aluminum nitride (AlN) cap over the metal gate and in the recess between the spacers and a barrier layer,
    wherein the metal gate comprises the barrier layer adjacent the spacers, and
    the recess is formed between an outer edge of the spacers and the barrier layer.

11. The device according to claim 10, wherein the recess has a depth of 3 nanometers (nm) to 10 nm.

12. The device according to claim 10, wherein the AlN cap has a uniform thickness of 1 nm to 10 nm above an upper surface of the metal gate.

13. The device according to claim 10, further comprising:
    an oxide layer covering the metal gate and AlN cap to a uniform height above a substrate; and
    a self-aligned contact (SAC) through the oxide layer.

14. The device according to claim 13, wherein the SAC partially overlaps the AlN cap.

15. The device according to claim 10, wherein:
    the barrier layer comprises titanium nitride (TiN).

16. A method comprising:
    forming a replacement metal gate, with spacers at opposite sides thereof and a barrier layer adjacent the spacers, on a substrate;
    forming a recess that penetrates an upper surface of the spacers, between an outer edge of the spacers and the barrier layer, and along outer edges of the replacement metal gate;
    forming an aluminum nitride (AlN) cap over the metal gate and in the recess by:
      forming an aluminum (Al) cap over the metal gate and in the recess between the spacers and barrier layer by a selective growth process, and
      converting the Al to AlN;
    forming an oxide layer to cover the metal gate and AlN cap to a uniform height above the substrate; and
    forming a self-aligned contact (SAC) through the oxide layer partially overlapping the AlN cap.

17. The method according to claim 16, comprising forming the recess by a dry or wet etch process.

18. The method according to claim 17, comprising:
    forming the recess to a depth of 3 nanometers (nm) to 10 nm; and
    forming the nitride cap to a uniform thickness of 1 nm to 10 nm above an upper surface of the metal gate.

19. The method according to claim 16, comprising converting the Al cap to AlN by a nitrogen plasma treatment or a nitrogen plasma doping process at a process temperature less than 400 degrees Celsius (° C.).

20. The method according to claim 16, comprising forming the SAC by reactive ion etching (RIE) a contact hole and filling the contact hole with a contact metal.

* * * * *